US009855615B2

(12) United States Patent
Guo

(10) Patent No.: US 9,855,615 B2
(45) Date of Patent: Jan. 2, 2018

(54) METHOD OF MODIFYING GEAR PROFILES

(71) Applicant: United Technologies Corporation, Hartford, CT (US)

(72) Inventor: Changsheng Guo, South Windsor, CT (US)

(73) Assignee: United Technologies Corporation, Farmington, CT (US)

( * ) Notice: Subject to any disclaimer, the term of this patent is extended or adjusted under 35 U.S.C. 154(b) by 365 days.

(21) Appl. No.: 14/425,875

(22) PCT Filed: Feb. 19, 2013

(86) PCT No.: PCT/US2013/026653
§ 371 (c)(1),
(2) Date: Mar. 4, 2015

(87) PCT Pub. No.: WO2014/051665
PCT Pub. Date: Apr. 3, 2014

(65) Prior Publication Data
US 2015/0217388 A1  Aug. 6, 2015

Related U.S. Application Data

(60) Provisional application No. 61/705,672, filed on Sep. 26, 2012.

(51) Int. Cl.
*B23F 19/00* (2006.01)
*B24B 49/02* (2006.01)
(Continued)

(52) U.S. Cl.
CPC ............ *B23F 19/002* (2013.01); *B23F 23/12* (2013.01); *B23Q 15/28* (2013.01); *B24B 49/02* (2013.01);
(Continued)

(58) Field of Classification Search
CPC .......... B23F 19/002; B23F 1/02; B24B 49/00; B24B 49/02; B24B 49/03; G05B 2219/35022; G05B 2219/43124
See application file for complete search history.

(56) References Cited

U.S. PATENT DOCUMENTS 3,906,677 A    9/1975  Gunter et al.
4,045,917 A    9/1977  Loos et al.
(Continued)

OTHER PUBLICATIONS

International Preliminary Report on Patentability for PCT Application No. PCT/US2013/026653, dated Apr. 9, 2015.
(Continued)

*Primary Examiner* — Timothy V Eley
(74) *Attorney, Agent, or Firm* — Carlson, Gaskey & Olds, P.C.

(57) ABSTRACT

A disclosed method utilizes virtual representations of gear profiles produced in view of accuracies and capabilities of specific machine and tool combinations to validate profile finishing parameters. The virtual representations are utilized to identify modifications needed to account for process capability and are implemented into the process to change the nominal profile utilized for producing the finished gear profiles. The resulting nominal gear profile accounts for process variations and thereby provides a more accurate and repeatable gear tooth profile.

15 Claims, 3 Drawing Sheets

(51) Int. Cl.
*B24B 49/03* (2006.01)
*B23F 23/12* (2006.01)
*B23Q 15/28* (2006.01)
*G06F 17/50* (2006.01)
*B23F 1/02* (2006.01)

(52) U.S. Cl.
CPC .............. *B24B 49/03* (2013.01); *G06F 17/50* (2013.01); *B23F 1/02* (2013.01); *G05B 2219/35022* (2013.01); *G05B 2219/43124* (2013.01); *G05B 2219/45124* (2013.01); *Y10T 409/107632* (2015.01)

(56) References Cited

U.S. PATENT DOCUMENTS

| | | | |
|---|---|---|---|
| 4,195,446 A | 4/1980 | Angst | |
| 5,297,055 A * | 3/1994 | Johnstone | B23F 23/12 700/195 |
| 5,315,790 A | 5/1994 | Kish et al. | |
| 5,396,711 A * | 3/1995 | Iwasaki | G01B 5/166 33/501.14 |
| 5,580,298 A | 12/1996 | Stadtfeld | |
| 6,044,555 A | 4/2000 | Jacob et al. | |
| 6,918,181 B2 | 7/2005 | Vinayak et al. | |
| 7,457,715 B1 | 11/2008 | Bhateja et al. | |
| 7,527,548 B2 | 5/2009 | Bittner et al. | |
| 7,627,390 B2 | 12/2009 | Mueller et al. | |
| 2010/0111628 A1 | 5/2010 | Megens et al. | |
| 2012/0072008 A1 | 3/2012 | Neumaier et al. | |
| 2012/0156963 A1 | 6/2012 | Vogler et al. | |

OTHER PUBLICATIONS

International Search Report and Written Opinion for International Application No. PCT/US2013/026653 dated Jun. 21, 2013.

* cited by examiner

METHOD OF MODIFYING GEAR PROFILES

CROSS REFERENCE TO RELATED APPLICATION

This application is a United States National Phase application of PCT/US2013/026653 filed on Feb. 19, 2013, which claims priority to U.S. Provisional Application No. 61/705,672 filed on Sep. 26, 2012.

BACKGROUND

Geared architectures include driven and driving gears also referred to as master and slave gears. Imperfections in the interface between gears can generate noise, vibrations, high stress and increased temperatures. Secondary machining processes are sometimes implemented to modify gear tooth configurations and profiles to reduce such imperfections. However, such processes rely heavily on trial and error experience based adjustments to provide the desired gear profile modifications. Moreover, analytical methods are often utilized to determine gear tooth deformation and the required geometry needed to correct such imperfections. However, such systems do no account for manufacturing and process capabilities.

Geared architectures have improved propulsive efficiency and turbine engine manufacturers continue to seek further improvements to gear tooth configurations.

SUMMARY

A method of finishing a gear tooth profile according to an exemplary embodiment of this disclosure, among other possible things includes determining a machine accuracy in repeating gear tooth profile forming processes, determining an accuracy of a tool mounted to the machine for forming a desired gear tooth profile, generating a representation of gear tooth profiles for mating gears utilizing the determined machine accuracy and the determined tool accuracy as a virtual simulation within a computer system, identifying deviations from a desired gear tooth profiles at an interface between the representation of gear tooth profiles of the mating gears with the computer system, determining modifications to the gear tooth profile accounting for the identified deviations from the desired gear tooth profiles, defining machine operating parameters required to provide the desired gear tooth profiles including the determined modifications to the gear tooth profile accounting for the identified deviations from the desired gear tooth profiles, and performing finishing operations of the gear tooth profiles of at least one of the mating gears.

In a further embodiment of the foregoing method, the step of determining an accuracy of a tool includes determining an accuracy of an abrasive wheel profile and a variation of the abrasive wheel profile caused by wear during operation.

In a further embodiment of any of the foregoing methods, the abrasive wheel profile includes a profile defining a groove and sides of adjacent gear teeth.

In a further embodiment of any of the foregoing methods, the step of determining an accuracy of the machine includes determining a repeatability of a machine's movement along a plurality of axes.

In a further embodiment of any of the foregoing methods, the step of determining an accuracy of the machine includes determining a repeatability of a center distance between the gear profile and a center point of the tool.

In a further embodiment of any of the foregoing methods, includes generating a simulation of the gear tooth finishing process as a computer simulation utilizing the determined machine and tool accuracy determinations and generating a simulation of finished gear teeth utilizing the computer simulation.

In a further embodiment of any of the foregoing methods, includes generating a simulation of a helical gear tooth finishing process and simulation of a finished helical gear tooth profile.

In a further embodiment of any of the foregoing methods, includes adjusting nominal machining process parameters based on the determined modifications to the gear tooth profile to provide a nominal finished gear tooth profile.

In a further embodiment of any of the foregoing methods, includes adjusting profile modifications to accommodate the identified deviations caused by manufacturing processes.

A computer system for generating gear profile deviations according to an exemplary embodiment of this disclosure, among other possible things includes a first module including information defining manufacturing process capabilities to produce a desired gear tooth profile. A second module models a process of finishing mating surfaces of gear tooth profiles in view of the information defining the manufacturing process capabilities provided in the first module. The second module generates a virtual representation of a completed gear set. A third module compares the virtual representation of an interface between the completed gear set to a desired gear tooth profile and define deviations from the desired gear tooth profile and defining variations in the desired gear tooth profile required to produce the desired gear tooth profile in view of manufacturing process capabilities.

In a further embodiment of the foregoing computer system, the first module comprises a portion for determining machine accuracy in repeating gear tooth profile forming processes.

In a further embodiment of any of the foregoing computer systems, the first module includes a portion for determining an accuracy of a tool mounted on the machine for forming the desired gear tooth profile.

In a further embodiment of any of the foregoing computer systems, the second module includes a virtual manufacturing process representing operation of the manufacturing processes capabilities defined in the first module.

In a further embodiment of any of the foregoing computer systems, the manufacturing process capabilities include repeatability of a center distance between the gear profile and a center point of the tool.

In a further embodiment of any of the foregoing computer systems, the system generates an adjusted set of profile modifications to accommodate deviations from the desired profile modifications caused by variations in manufacturing processes.

Although the different examples have the specific components shown in the illustrations, embodiments of this disclosure are not limited to those particular combinations. It is possible to use some of the components or features from one of the examples in combination with features or components from another one of the examples.

These and other features disclosed herein can be best understood from the following specification and drawings, the following of which is a brief description.

DETAILED DESCRIPTION

Figure 1:
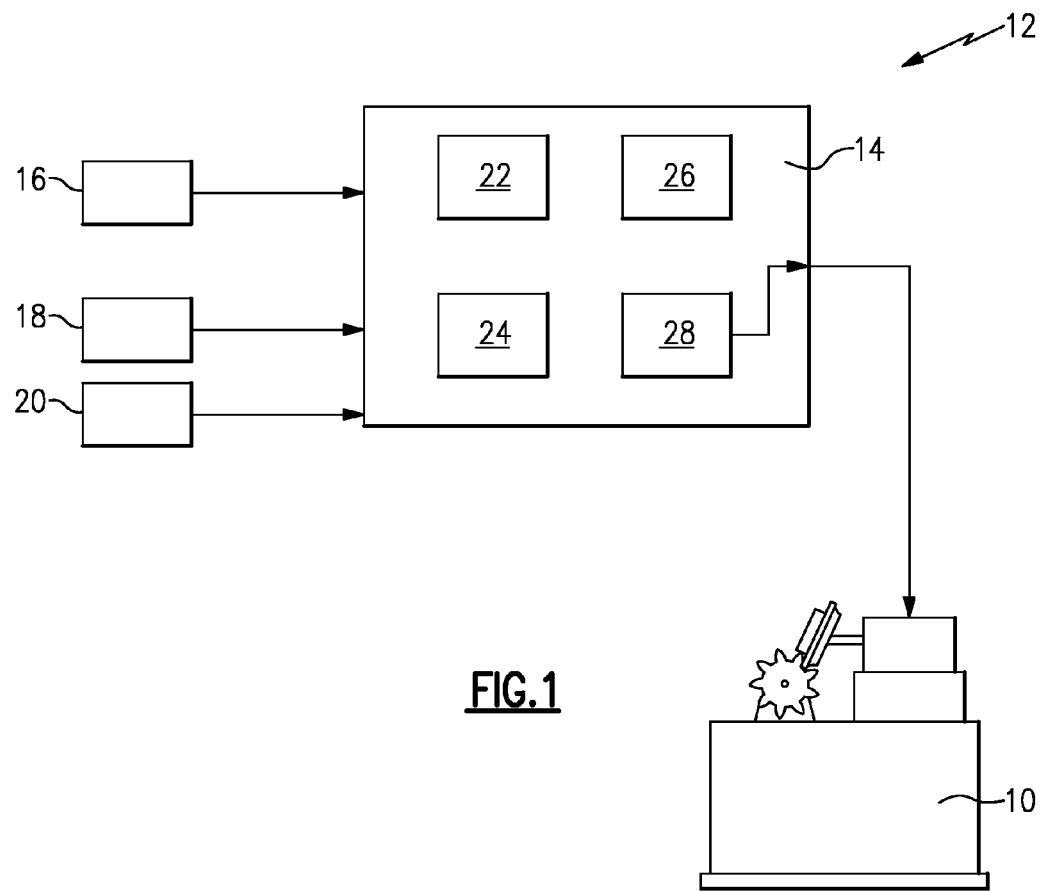
FIG. 1 is a schematic view of an example system for finishing a gear tooth profile.

Referring to FIG. 1, an example system for finishing a gear tooth profile is schematically illustrated at 12 and includes a gear finishing machine 10 that receives instructions from a computer control system 14. The example computer control system 14 provides instructions to operate the machine 10 according to specific parameters required for tooth profile finishing.

Transmission errors between mating gears can cause noise vibration, high localized stresses, and increased temperatures. Accordingly, the mating profile for mating gears are modified and finished to account for the mismatch and deformation under load that may occur between mating tooth profiles. Deformations of gear tooth profiles or mismatch between interfacing gears can be caused by variations in a manufacturing process.

The example computer control system 14 receives a machine capability input 16, a tool accuracy input 18 and a wheel profile input 20. The example inputs 16, 18 and 20 are only examples, and additional inputs could be utilized and are within the contemplation of this disclosure.

The example computer system 14 is schematically shown and includes first, second and third modules 22, 24, and 26. The first module 22 includes information defining manufacturing process capabilities to produce a desired gear tooth profile. The second module 24 models the process of finishing mating surfaces of gear tooth profiles in view of the information defining the manufacturing process capabilities provided in the first module 22. The second module 24 further generates a computer simulation of a manufacturing process and a virtual representation of a completed gear set. The third module 26 compares the virtual representation of an interface between the completed gear set to a desired gear tooth profile and defines deviations from the desired gear tooth profile. The third module 26 further defines variations in the desired gear tooth profile required to produce the desired gear tooth profile in view of manufacturing process capabilities.

The computer system 14 includes a fourth module 28 that converts the information obtained and generated from the first, second and third modules 22, 24 and 26 into machine executable instructions communicated to the machine 10 for fabricating the desired gear profile.

Figure 4:
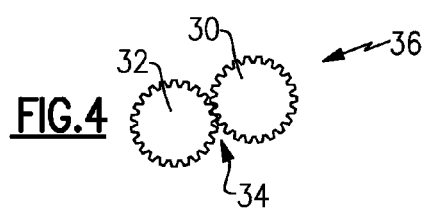
FIG. 4 is a schematic representation of an example gear set.
Figure 2:
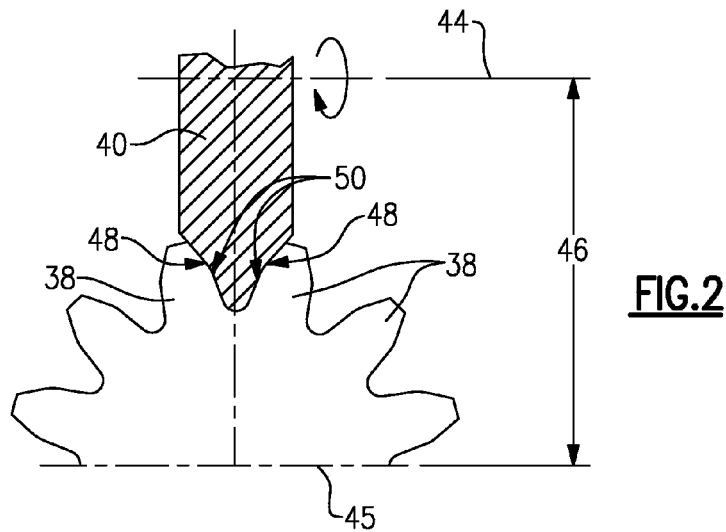
FIG. 2 is a schematic representation of a finishing process of a gear.
Figure 3:
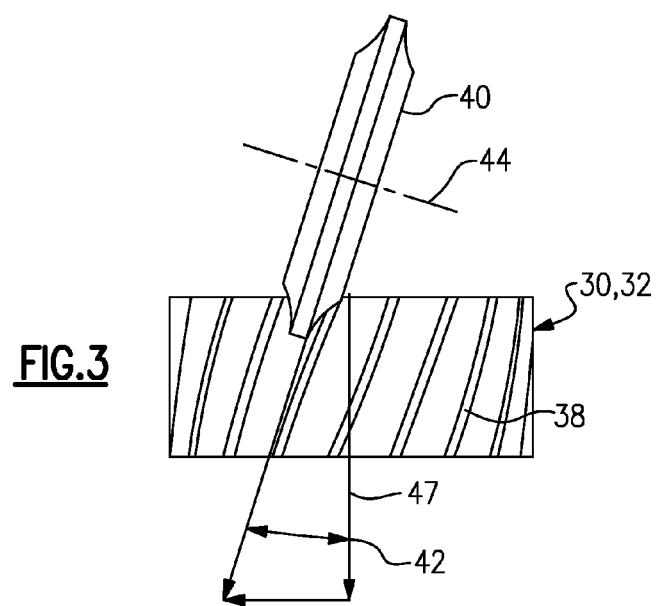
FIG. 3 is another schematic representation of a finishing process for an example helical gear.

Referring to FIGS. 2, 3 and 4 with continued reference to FIG. 1, gear teeth 38, 35 for mating helical gears 30 and 32 (FIG. 4) are often finished using a profile grinding process. The profile grinding process utilizes a tool such as the example abrasive wheel 40 that is rotated between adjacent teeth 38. The wheel 40 rotates about a centerline 44 that is spaced a distance 46 away from a center point of the gear 30, 32.

In the example illustrated in FIG. 2, a simple spur gear is illustrated. However, this process can be utilized for other gear configurations such as helical gears and other mating gears that require tooth profiles be finished according to desired accuracy and repeatability standards.

In this example, the wheel 40 includes a common profile on each of its sides 48 to provide a common surface on each of the corresponding sides 50 of example teeth 38. For helical gears, an angle indicated at 42 is also implemented and utilized to define the desired profile for the gear teeth 38. The profile accuracy of each of the gears 38, 35 is determined by the repeatability of the machine tool 10, and the accuracy of the wheel profile.

The example profile gear tooth finishing process includes driving of the wheel 40 down between the spacing between adjacent gear teeth 38. The desired profile of each gear tooth 38 determines a profile of the wheel 40 and also defines the motion of the machine 10. The tool axis 44 is positioned a distance 46 from a gear centerline 45. The rotational axis 44 of the tool 40 may also be set at the angle 42 relative to a gear axis 47 during finish machining.

Machining of the gear 30, 32 includes rotation at a desired speed with the wheel 40 moved from one side of the gear 30, 32 to the other at a speed equal to a product of a lead speed and a rotational speed of the wheel 40. Each tooth 38 of the gear 30 is finished with each pass of the wheel 40 across the gear 30, 32.

Figure 5:
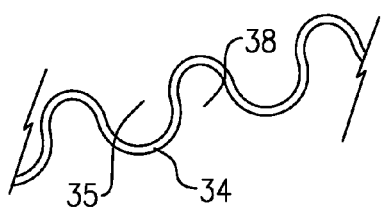
FIG. 5 is an enlarged view of an example interaction interface between mating gear teeth.
Figure 6:
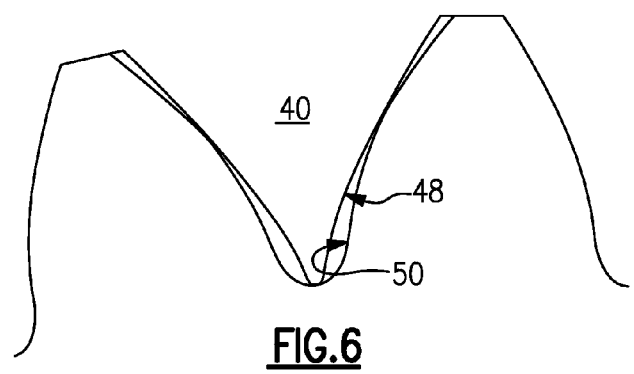
FIG. 6 is an enlarged view of an example interface between a grinding wheel and tooth profile.

Referring to FIGS. 4, 5, and 6 with continued reference to FIGS. 2 and 3, a nominal gear profile is attained if all of the tooling parameters are set at nominal values. However, nominal values are not attained as each of the devices including the wheel 40 and machine 10 operate within a tolerance band. The smaller the tolerance band, the closer to the nominal desired tooth profile 50 is produced.

However, as is true with any manufacturing process, a certain degree of inaccuracy will be present within the completed gear profile. Moreover, in complex gear profiles such as is utilized in helical gears, the inaccuracies or deviations from the desired nominal tooth profile are magnified as each of the angles and parameters contribute to deviations from a nominal profile. Accordingly, it is desired to reduce deviation from the nominal, desired gear profile. Typically, machine parameters and settings are modified based on experience attained during part fabrication. That is, machine parameters will be modified based on measurements to produce gear profiles in an attempt to obtain a gear tooth profile closer to nominal conditions.

Accordingly, a disclosed method accounts for machine and process variations to provide a gear profile with reduced deviations to attain a completed gear tooth profile within desired specifications.

Figure 7:
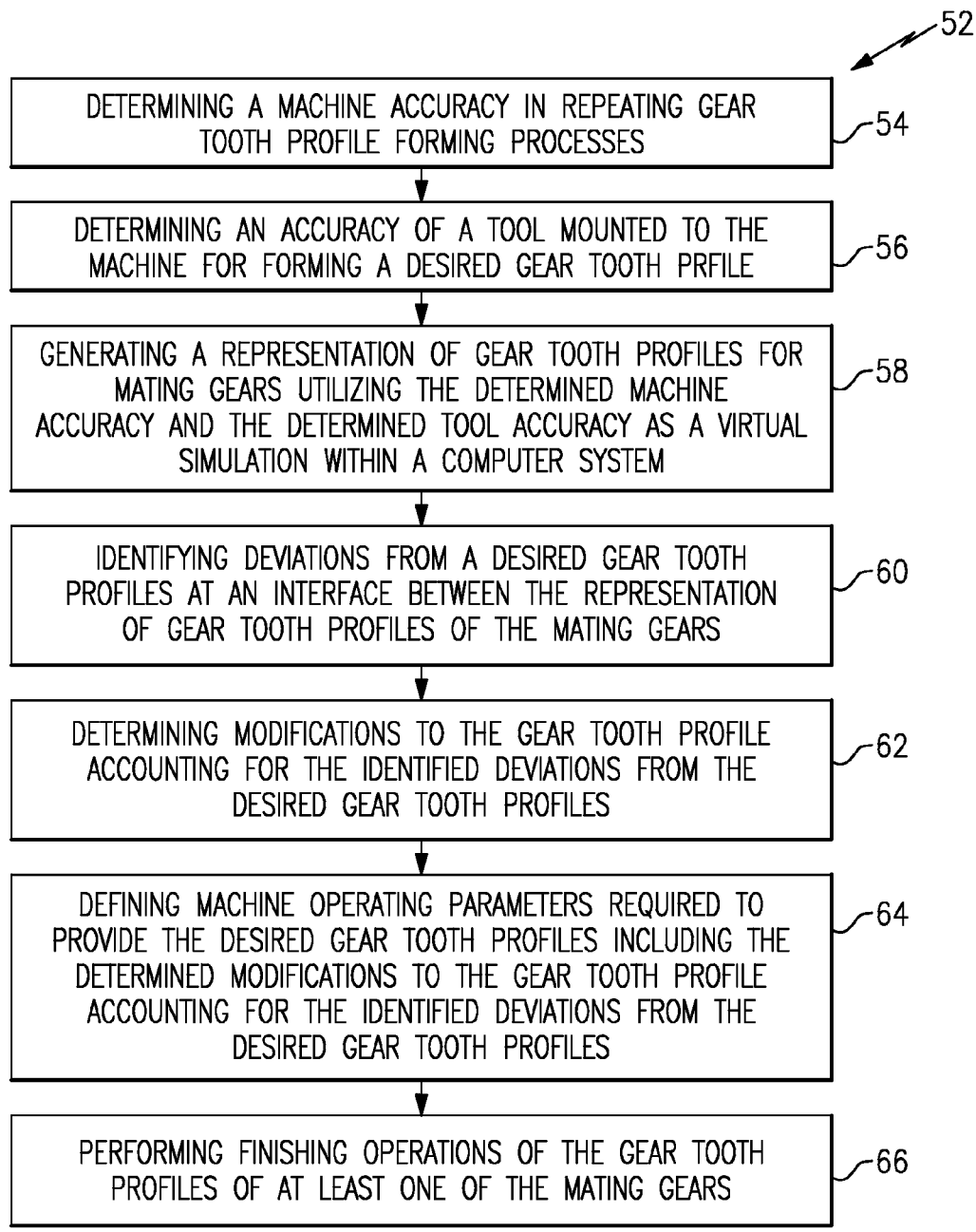
FIG. 7 is a flow diagram illustrating process steps for an example method of finishing a gear tooth profile.

Referring to FIG. 7 with continued reference to FIGS. 1, 2 and 3, the example method utilizes the computer system 14. The example computer system 14 receives input 16 relating to process variation and accuracy parameters including the repeatability capabilities of the machine 10. Moreover, the computer system 14 receives inputs 18, 20 related to the accuracy of the wheel 40 configurations. This information is utilized to generate a virtual gear profile which is then utilized to identify and generate modifications to account for the process variation.

The example method 52 begins with a first step of selecting the machine 10 that will be utilized for the finished machining process. An accuracy of the machine 10 is determined for the machine as is indicated at 54. The accuracy or repeatability of the machine 10 is input into the system 14 as an input indicated at 16. In this example, the repeatability of the machine 10 includes the ability of the machine 10 to repeat movement to a desired distance between a center of the wheel 40 and the gear wheel center line 45 along with the attaining the mounting angle 42, indexing accuracy after machining each tooth.

A wheel profile is utilized to generate a gear profile based on the optimum setup conditions determined for the machine 10. A valid tool profile satisfies an external tangency requirement at the contact point between the tool 40 and the gear tooth profile.

As is indicated at 58, the determined accuracy of the wheel is determined and provided as input 18 into the computer system 14. The wheel 40 includes a specific profile accuracy that is predetermined and provided as part of the input 20 relating to tool accuracy. The inputs 18, 20 will also include information indicative of wheel 40 accuracy included in variations due to wear of the tool profile and are utilized within the system 14.

The system 14 generates a representation of gear tooth profiles as a computer simulation indicated at 58. The representation in this example is generated by the second module 24 of the computer system 14. The first module 22 of the computer system 14 receives the information relating to accuracy of the machine 10 and the tool 40. The information provided on the accuracy of the machine 10 and the tool, wheel 40 in this example, is utilized to virtually produce a mating gear set.

The virtual manufacturing step indicated at 58 performed by the module 24 accounts for the machine and process accuracies to produce a virtual gear profile that represents the capabilities of machine and tool parameters in a virtual gear finishing process. A virtual mating gear set generated in view of machine accuracy capabilities and profile wheel tolerances provides for an analysis of mating surfaces between gear teeth 38, 35.

Once the virtual gears are produced, deviations from a nominal are identified as is indicated at 60. The deviations from nominal are identified at the interface 34 (FIG. 4) between the representations of gear tooth profiles for the mating gears.

Once the deviations from the nominal between the interface of mating gears are identified as is indicated at 60, modifications to the nominal gear profile utilized for machining are determined as is indicated at 62. The modifications to the gear tooth profile are utilized to generate deviations utilized in the process of finishing gears to eliminate the identified deviations and provide a better mating interface between gear teeth 38, 35.

Once modifications based on manufacturing capabilities are identified and deviations determined, specific machine operating instructions can be defined as is generally indicated at 64. The example method converts the identified deviations from nominal due to manufacturing capabilities and tool accuracies into new manufacturing instructions relating to the specific machine. The module 28 of the computer system 14 then generates a specific set of machine operating parameters and instructions that are required to provide desired gear tooth profiles in view of the deviations identified in the virtually produced gear sets.

The method further includes repeating the process with the new gear tooth profiles to validate, and check the data produced and the ability of the newly modified profiles to produce a gear tooth within desired parameters. Once a desired profile is attained through the virtual representations of the mating gears, the process can move to actual finishing of gear profiles.

The method concludes with the machine 10 utilizing the wheel 40 and the new instructions to perform finishing operations 66 to produce gear tooth profiles as are desired for mating gear sets.

Accordingly, the example method utilizes virtual representations of gear profiles produced in view of accuracies and capabilities of specific machine and tool combinations to validate profile finishing parameters. The virtual representations are utilized to identify modifications needed to account for process capability and are implemented into the process to change the nominal profile utilized for producing the finished gear profiles. The resulting nominal gear profile accounts for process variations and thereby provides a more accurate and repeatable gear tooth profile.

Although an example embodiment has been disclosed, a worker of ordinary skill in this art would recognize that certain modifications would come within the scope of this disclosure. For that reason, the following claims should be studied to determine the scope and content of this disclosure.

What is claimed is:

1. A method of finishing a gear tooth profile comprising:
   determining a machine accuracy in repeating gear tooth profile forming processes;
   determining an accuracy of a tool mounted to a machine for forming a desired gear tooth profile;
   generating a representation of a gear tooth profile for mating gears utilizing the determined machine accuracy and the determined tool accuracy as a virtual simulation within a computer system;
   identifying deviations from a desired gear tooth profile at an interface between the representation of the gear tooth profile of the mating gears with the computer system;
   determining modifications to the representation of the gear tooth profile accounting for the identified deviations from the desired gear tooth profiles;
   defining machine operating parameters required to provide the desired gear tooth profiles including the determined modifications to the gear tooth profile accounting for the identified deviations from the desired gear tooth profiles; and
   performing finishing operations of the gear tooth profiles of at least one of the mating gears.

2. The method as recited in claim 1, wherein the step of determining an accuracy of a tool comprises determining an accuracy of an abrasive wheel profile and a variation of the abrasive wheel profile caused by wear during operation.

3. The method as recited in claim 2, wherein the abrasive wheel profile includes a profile defining a groove and sides of adjacent gear teeth.

4. The method as recited in claim 1, wherein the step of determining an accuracy of the machine comprises determining a repeatability of the machine's movement along a plurality of axes.

5. The method as recited in claim 1, wherein the step of determining an accuracy of the machine comprises determining a repeatability of a center distance between the desired gear profile and a center point of the tool.

6. The method as recited in claim 5, including generating a simulation of a helical gear tooth finishing process and simulation of a finished helical gear tooth profile.

7. The method as recited in claim 1, including generating a simulation of a gear tooth finishing process as a computer simulation utilizing the determined machine and tool accuracy determinations and generating a simulation of finished gear teeth utilizing the computer simulation.

8. The method as recited in claim 1, including adjusting nominal machining process parameters based on the determined modifications to the gear tooth profile to provide a nominal finished gear tooth profile.

9. The method as recited in claim 1, including adjusting profile modifications to accommodate the identified deviations.

10. A computer system for generating gear profile deviations comprising:

a first module including information defining manufacturing process capabilities to produce a desired gear tooth profile;

a second module modeling a process of finishing mating surfaces of gear tooth profiles in view of the information defining the manufacturing process capabilities provided in the first module, the second module generating a virtual representation of a completed gear set; and a third module comparing the virtual representation of an interface between the completed gear set to a desired gear tooth profile and define deviations from the desired gear tooth profile and defining variations in the desired gear tooth profile required to produce the desired gear tooth profile in view of manufacturing process capabilities.

11. The computer system as recited in claim 10, wherein the first module comprises a portion for determining machine accuracy in repeating gear tooth profile forming processes.

12. The computer system as recited in claim 10, wherein the first module includes a portion for determining an accuracy of a tool mounted on a machine for forming the desired gear tooth profile.

13. The computer system as recited in claim 10, wherein the second module comprises a virtual manufacturing process representing operation of the manufacturing process capabilities defined in the first module.

14. The computer system as recited in claim 13, wherein the manufacturing process capabilities include repeatability of a center distance between the gear profile and a center point of a tool.

15. The computer system as recited in claim 10, wherein the system generates an adjusted set of profile modifications to accommodate deviations from the desired gear tooth profile.

* * * * *